United States Patent
Berrian et al.

(10) Patent No.: US 6,765,219 B2
(45) Date of Patent: Jul. 20, 2004

(54) HYBRID SCANNING SYSTEM AND METHODS FOR ION IMPLANTATION

(75) Inventors: Donald W. Berrian, Topsfield, MA (US); John D. Pollock, Rowley, MA (US); John W. Vanderpot, Boxford, MA (US)

(73) Assignee: Variah Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/990,848

(22) Filed: Nov. 21, 2001

(65) Prior Publication Data

US 2002/0109106 A1 Aug. 15, 2002

Related U.S. Application Data

(60) Provisional application No. 60/252,549, filed on Nov. 22, 2000.

(51) Int. Cl.[7] .................................................. H01J 37/00
(52) U.S. Cl. .................................................. 250/492.21
(58) Field of Search ........................ 250/492.21, 492.2, 250/442.11

(56) References Cited

U.S. PATENT DOCUMENTS

| | | |
|---|---|---|
| 3,689,766 A | 9/1972 | Freeman |
| 3,778,626 A | 12/1973 | Robertson |
| 4,021,675 A | 5/1977 | Shifrin |
| 4,421,988 A | 12/1983 | Robertson et al. |
| 4,494,005 A | 1/1985 | Shibata et al. |
| 4,726,689 A | 2/1988 | Pollock |
| 4,922,106 A | 5/1990 | Berrian et al. |
| 4,943,728 A * | 7/1990 | Dykstra et al. ........... 250/492.3 |
| 4,980,562 A | 12/1990 | Berrian et al. |
| 5,229,615 A | 7/1993 | Brune et al. |
| 5,350,926 A | 9/1994 | White et al. |
| 5,406,088 A * | 4/1995 | Brune et al. ............ 250/492.21 |
| 5,898,179 A * | 4/1999 | Smick et al. ........... 250/492.21 |
| 5,981,961 A | 11/1999 | Edwards et al. |
| 6,163,033 A * | 12/2000 | Smick et al. ........... 250/441.11 |
| 6,437,351 B1 * | 8/2002 | Smick et al. ........... 250/492.21 |

FOREIGN PATENT DOCUMENTS

| | | |
|---|---|---|
| EP | 0398269 A2 | 11/1990 |
| EP | 0542560 A1 | 5/1993 |
| EP | 1083587 A2 | 3/2001 |

OTHER PUBLICATIONS

S. Radovanov, R. Liebert, P. Corey, J. Cummings, G. Angel, J. Buff, "In Situ Charging Potential Monitoring for a High Current Ribbon Beam", VSEA Technical Publications, Doc. No 0SEB358, Sep. 5, 2000, pp. 1–4.

J.C. Olson, A. Renau, J. Buff, "Scanned Beam Uniformity Control in the VIISta 810 Ion Implanter", 1998 International Conference on Ion Implantation Technology Proceedings, Kyoto, Japan, IEEE 1999, pp. 169–172.

* cited by examiner

Primary Examiner—Jack Berman
Assistant Examiner—Johnnie L. Smith, II

(57) ABSTRACT

An ion implantation system contains, in the ion implantation chamber, a workpiece holder that scans vertically while tilting a wafer at an angle of rotation that is rotated out of a perpendicular orientation with respect to the axis of projection in an ion beam. The implant angle into an implant surface on wafer that is retained by the workpiece holder is adjusted by selective rotation of the workpiece holder about its path of motion. A Faraday cup scans the ion beam along the intended location of the implant surface to form a setup measurement plane. The ion beam quality is adjusted to enhance beam uniformity along the setup plane according to these tilt-angle measurements. A charge neutralizing device, such as a flood gun, is moved in operational alignment with the workpiece.

7 Claims, 6 Drawing Sheets

HYBRID SCANNING SYSTEM AND METHODS FOR ION IMPLANTATION

RELATED APPLICATIONS

This application claims benefit of priority to provisional application Ser. No. 60/252,549 filed Nov. 22, 2000, which is hereby incorporated by reference to the same extent as though fully replicated herein.

FIELD OF THE INVENTION

The invention pertains to the field of ion implantation equipment and, more specifically, to serial ion implantation equipment.

BACKGROUND OF THE INVENTION

In ion implantation, a beam of energetic ions impinges upon a surface of material to imbed or implant those ions into the material. Ion implantation processes are categorized into batch and serial processes. Serial processes are the most common type of ion implantation processes, and are associated with medium dose implantation. Serial processes most often use a plasma ion beam that is subjected to electrostatic deflection processes in both axes normal to the direction of beam propagation. The electrostatic deflection processes are intended to provide a uniform distribution of ions in terms of density and direction of travel, but in practice ion beams vary in angle by as much as 3° relative to the direction of beam propagation. This variance produces undesirable effects in the ion implantation processes, as reported in U.S. Pat. No. 4,726,689 to Pollock.

U.S. Pat. Nos. 5,406,088 and 5,229,615 to Brune et al. describe a parallel beam ion implantation device that was developed in response to increasing commercial use of large wafer diameters. The growth in wafer diameter from 4" to 6" and then to 8" in diameter has generated a need for a serial implantation device capable of producing a beam that strikes the surface of the wafers with a uniform parallel beam while also permitting tilt and rotational control of the wafers.

U.S. Pat. No. 5,350,926 to White et al. describes a high current broad beam ion implanter with emphasis upon systems for beam control to establish uniformity across a large ribbon shaped beam traveling in a single transverse direction. The ion implanter uses a Freeman, Bernas, or microwave source, from which the ion beam is extracted from source plasma through a parallel-sided convex slot. The ion beam passes through a pair of analyzing magnets to render the beam parallel in both axes normal to the direction of beam propagation. U.S. Pat. No. 4,922,106 to Berrian et al. similarly shows an ion beam implantation device having a parallel beam generator together with mechanical and electrical scan controls that facilitate uniform implantation.

Hybrid scanning systems are the type most often used in modern serial processing ion implantation equipment. Processing occurs for one wafer at a time. As shown in FIG. 1, which is a midsectional side elevational view, it is common to mechanically scan a wafer 100 in one axis by passing the wafer 100 through a scanned ion beam 104, i.e., an ion beam 104 that is projected from source 102. The horizontal ion beam 104 has a transverse axis 106 with respect to the vertical axis 108 of wafer motion. The axis 106, as shown in FIG. 1 is an average representation of the beam axis. Portions of the ion beam 104 may be slightly off-axis due to beam shaping field elements, such as shown in U.S. Pat. No. 5,350,926 to White et al. Generally, the wafer 100 is vertically translated along axis 108 through the horizontally scanned ion beam 104 as a means of distributing the ion beam uniformly over the wafer surface. It is necessary to setup the incoming ion beam 104 prior to implanting the wafer 100, in order to achieve uniform implantation by this scanning method. These processes occur in a beam implant vacuum chamber 110. A wafer holder 112 may comprise an arm, a linear conveyor, or any other type of wafer holder. The wafer holder 112 presents a wafer surface 114 that is available for ion implantation through the effects of ion beam 104.

As shown in FIG. 2, which is a midsectional top plan view, setup of the scanned ion beam 104 for uniform implantation is accomplished by sampling with a faraday cup 200 that moves horizontally across the full beam width W in a direction that is normal to the beam axis 106 at the setup plane 202. The setup plane 202 is ideally located where the wafer implant occurs on surface 114 (see FIG. 1). The faraday cup 200 is deployed at a plurality of sampling stations, e.g., stations 204 and 206, to provide a fair representation of the beam uniformity at all positions on setup plane 202. Ion beam current collected by the faraday cup 200 is measured as a function of faraday cup position. Subsequent adjustments to the ion beam optical elements in source 102 are made by conventional means to even out the beam current, e.g., as taught in U.S. Pat. No. 5,350,926 to White et al. Measurement of beam current and adjustment of the ion optics are repeated according to conventional practices until the beam current is uniform within acceptable limits.

As shown in FIG. 3, hybrid implantation systems have process requirements that mandate control of the angle 300 of ion beam incidence with respect to the wafer surface 114 during implantation, for example, as described in U.S. Pat. No. 5,898,179 to Smick et al. This control is usually accomplished by tilting the wafer 100 within the wafer holder 112. Tilting occurs with respect to the trajectory of ion beam 104 and the mechanical scan axis 108. This tilting produces an angle 300 of incidence between the incoming ion beam 104 and the wafer surface 114 that is constant everywhere on the wafer. The mechanical translation of wafer 100 continues, as before, in a vertical direction along axis 108. The incident angle 300 generally ranges from 0° to 45° and is measured in the y-axis plane between the ion beam trajectory along axis 106 and the axis 304 that is normal to the implanted wafer surface 114. For example, a 0° implant angle occurs when the wafer implant surface 114 is oriented at 90° relative to the ion beam trajectory along axis 106.

Tilting the wafer 100 with respect to the mechanical scan axis 108 can have a deleterious effect on the uniformity of ion implantation because some regions of the wafer surface 114 are not implanted in the same focal plane as the setup plane 202. These problems are exacerbated by the current trend of using larger wafers, so that distances between the setup plane 202 and the plane of surface 114 can be significant. Where the wafer 100 is tilted by rotation relative to the mechanical scan axis 108, one end 306 of the wafer rotates toward the incoming ion beam 104 while the other end 308 rotates away. The middle region 310 of the wafer 100 remains in the setup plane. If, for example, the horizontal tilt axis is located entirely below the wafer 100, then the entire wafer moves out of the setup plane 202. Ion beam current uniformity is not specifically known other than in the setup plane 202 where it was actually measured. Therefore, the implant and setup planes should be coplanar.

The ion beam 104 contains positively charged plasma particles, which impinge upon surface 114 to impart a net charge on wafer 100. The effects of this imparted charge are cancelled, according to conventional practices, by utilizing a flood gun 312 to emit an electron stream 314. An exemplary ion implantation system including a flood gun for use in neutralizing accumulated plasma charges is the VIISta 80 ion implanter that is produced by Varian Semiconductor Equipment of Glouchester, Mass., as described, for example, in Radonov et al., *In Situ Charging Potential Monitoring for a High Current Ribbon Beam* (a Varian Trade Publication 2001). The electron stream 314 impinges upon wafer 100 to cancel the net charge. As wafer 100 is tilted in increasing magnitude of angle 300, surface 114 is increasingly exposed to the electron stream 314, and there is a corresponding increase in contact from electron stream 314 with associated net charge effects on wafer 100. Similarly, surface 114 is less exposed to the ion beam 104 by virtue of this tilting with associated net charge effects on wafer 104. These net charge effects, in combination, produce problematic localized field distortions that vary the uniformity of ion beam 104 as a function of the magnitude of angle 300 and related variances in the travel distance for ion beam 104.

Attempted improvements to tilt-scanning systems include adjustments to the wafer moving systems such that the wafer translational axis moves as a function of angle 300 to a new axis 108'. The entire wafer scanning apparatus in chamber 110 is tilted on a horizontal axis to accomplish this effect. This tilted displacement of the translational axis 108 to axis 108' assures that the center of ion beam 104 impinges upon all points of surface 114 at a constant focal distance regardless of the magnitude of angle 300. Accordingly, the method produces parallel scan implants at a selected angle 300 without implanting outside of the beam focal plane. Setup of ion beam 104, according to these improved methods, proceeds horizontally as shown in FIG. 2.

These improvements are associated with numerous problems, such as an increased length of scan stroke along axis 108', which results in significantly increased mass, complexity and cost in constructing the motive system within vacuum chamber 110. Wafer handling structures, such as wafer feeding and disposition systems, must be able to work in cooperation with the tilted axis 108' at a variety of angles. The flood gun 312 is usually positioned so close to wafer 100 that the flood gun interferes with the motion of wafer handling and transfer systems in the implantation chamber 110. System reliability and repeatability are reduced by these complexities, and wafer handling capacity is reduced.

SUMMARY OF THE INVENTION

The hybrid scan system and method of the invention solves the problems outlined above by providing an ion implantation system that achieves uniformity when tilting wafers out of the setup plane without tilting the entire mechanical scan axis. In summary, the system deliberately tilts the wafer out of the typical setup Faraday sample plane to provide an implant angle. A two-axis faraday performs the beam setup in the implant plane at the exact implant angle, to eliminate out-of-focal plane problems. The overall system is advantageously simpler, smaller, more reliable and less costly to use than are prior systems.

The ion implantation system includes a source of ions that are scanned linearly along a first axis to produce an ion beam, such as a parallel path fan beam having a two dimensional cross section that is normal to the first axis and at least twice as large in one dimension than another. A workpiece holder, such as a wafer holder, is configured for mechanical scanning in linear motion along a path of motion perpendicular to the first axis. This configuration is achieved, for example, through the use of a first vertically extensible drive arm that is rotatable about its axis of extension. Selectively adjustable rotation control structure is utilized for rotating the workpiece using the direction of the vertically extensible path of motion as an axis of rotation to orient an implant surface on a workpiece at a selected angle of rotation when the workpiece is installed in the workpiece holder. A beam measuring device, such as a Faraday cup, is configured for scanning along an intended location of the implant surface to provide a setup measurement coincident with the intended location. Thus, the setup plane of the beam measurements is not perpendicular to the direction of ion beam propagation when the workpiece holder is rotated.

Other aspects and instrumentalities include using at least one charge neutralization device, such as an electron flood gun or a plasma bridge, which is directed towards the workpiece holder for neutralization of beam charge buildup. A rotatable mechanism is configured to maintain the charge neutralization device in corresponding rotational alignment with the workpiece holder. For example, the charge neutralization device may be mounted on a second vertically extensible drive arm that is rotatable about its axis of extension. The rotatable mechanism associated with the charge neutralization device and aligned with the first vertically extensible drive arm such that the rotatable mechanism can be rotated in linear alignment with the selectively adjustable rotation control structure. This alignment maintains an orientation of the angular rotation and spacing of the charger neutralization device and the workpiece holder.

The foregoing system is used in a method for ion implantation of a workpiece comprising the steps of generating an ion beam perpendicular to a first XY plane having an X-axis and a Y-axis; scanning the beam across the workpiece along the X axis of the first XY plane; identifying a second plane by rotating the first XY plane about the Y-axis; measuring the effective ion beam intensity along a line in a second plane to provide a beam intensity signal; and adjusting the ion beam based upon the beam intensity signal to obtain an adjusted ion beam having a more uniform ion beam intensity along the line in the second plane; rotating the workpiece to present an implant surface in alignment with the second; and translating the workpiece along the Y axis of concomitantly with the XY planes to pass the workpiece through the adjusted ion beam to accomplish ion implantation in the workpiece. The method may further comprise the steps of positioning a charge neutralization device in a position of rotational alignment with the workpiece prior to the step of rotating the workpiece; and re-aligning the charge neutralization device into the position of rotational alignment after the step of rotating the workpiece.

The foregoing system and method offer several advantages. The implant plane and the setup planes are coplanar and unaffected by beam height and/or implant angle. The scan axis is not tilted at all so scan stroke is minimized and wafer exchange height is typical as well as easily optimized. Because tilting is achieved by rotating a much smaller inertial mass it can be done quickly to maximize wafer throughput. Because the tilt motion is not used to move wafers between the implant and wafer load positions, the required range of tilt axis motion is driven only by implant angle requirements; 45 degrees instead of 90. This reduces the time required to exchange wafers and hence increases wafer throughput. The smaller inertial mass to be tilted also means that the motion can be produced with less powerful drives which are smaller and less costly. The optional flood gun is easily positioned close to the wafer flood gun-to-wafer geometry kept constant over the full range of implant angles. This is accomplished by simply mounting the flood gun from the ceiling of the implant chamber and rotating it about the scan axis to match the implant angle.

BRIEF DESCRIPTION OF THE DRAWINGS

While there have been shown and described what are at present considered the preferred embodiments of the present invention, it will be obvious to those skilled in the art that various changes and modifications may be made therein without departing from the scope of the invention as defined by the appended claims.

DETAILED DESCRIPTION

Figure 1:
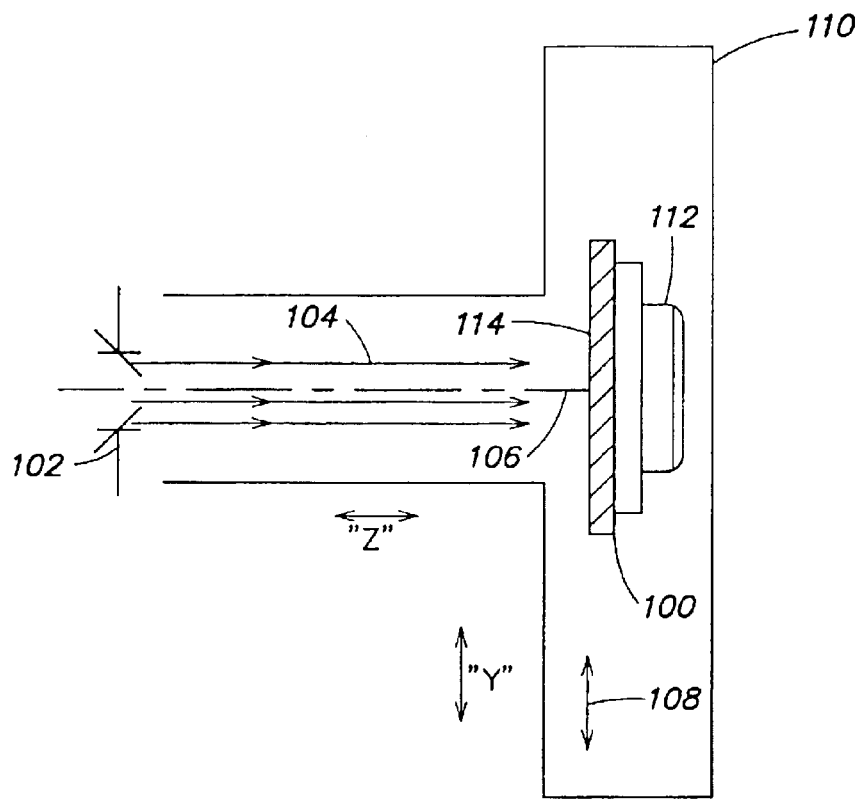
FIG. 1 is a side elevation midsectional view of an ion implantation system as is used in the prior art.
Figure 2:
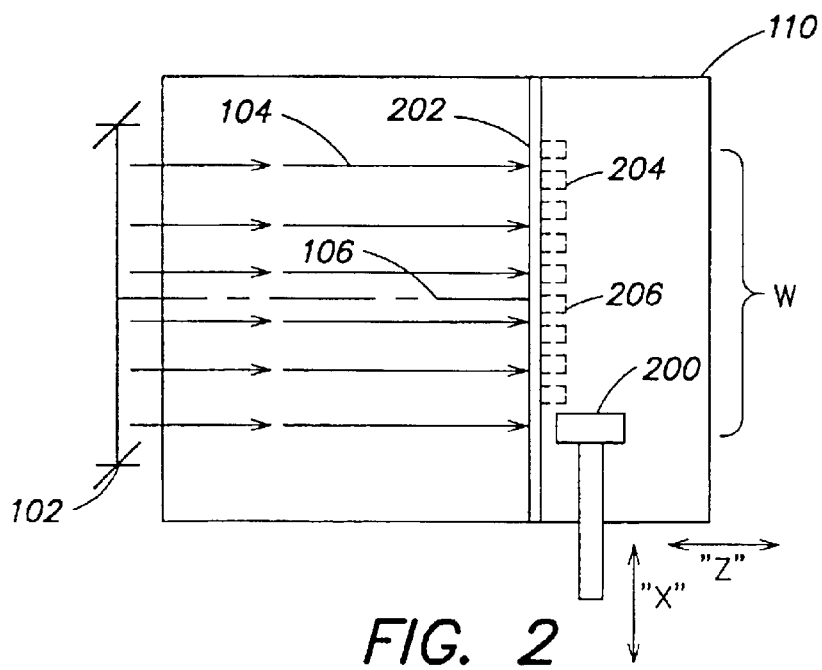
FIG. 2 is a top plan midsectional view of a prior art sampling system that uses a Faraday cup over a setup plane that is normal to a scanned ion beam.
Figure 3:
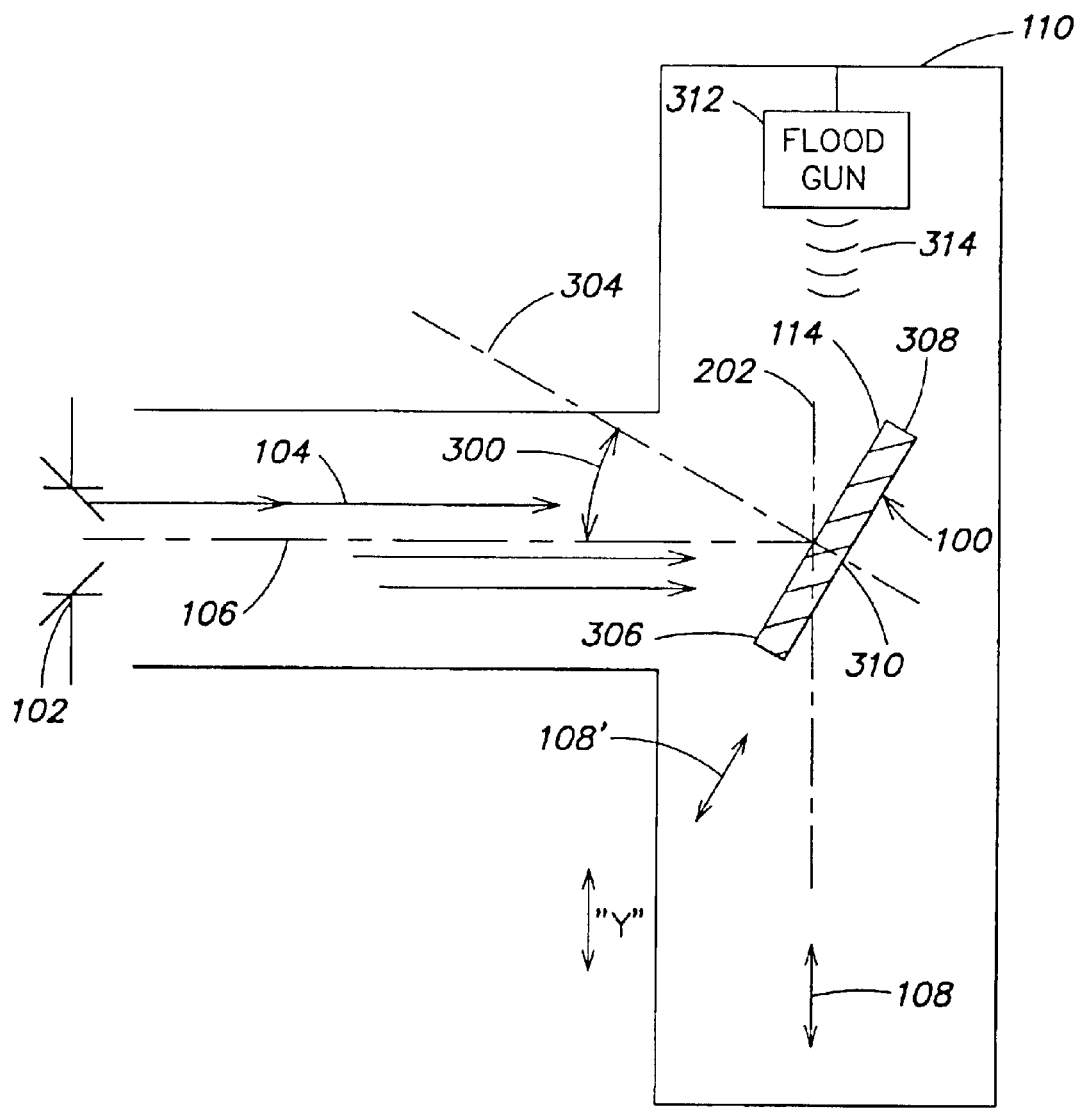
FIG. 3 is a side elevation midsectional view depicting a prior art ion implantation device including a tilt wafer system for adjustment of implant angle.
Figure 4:
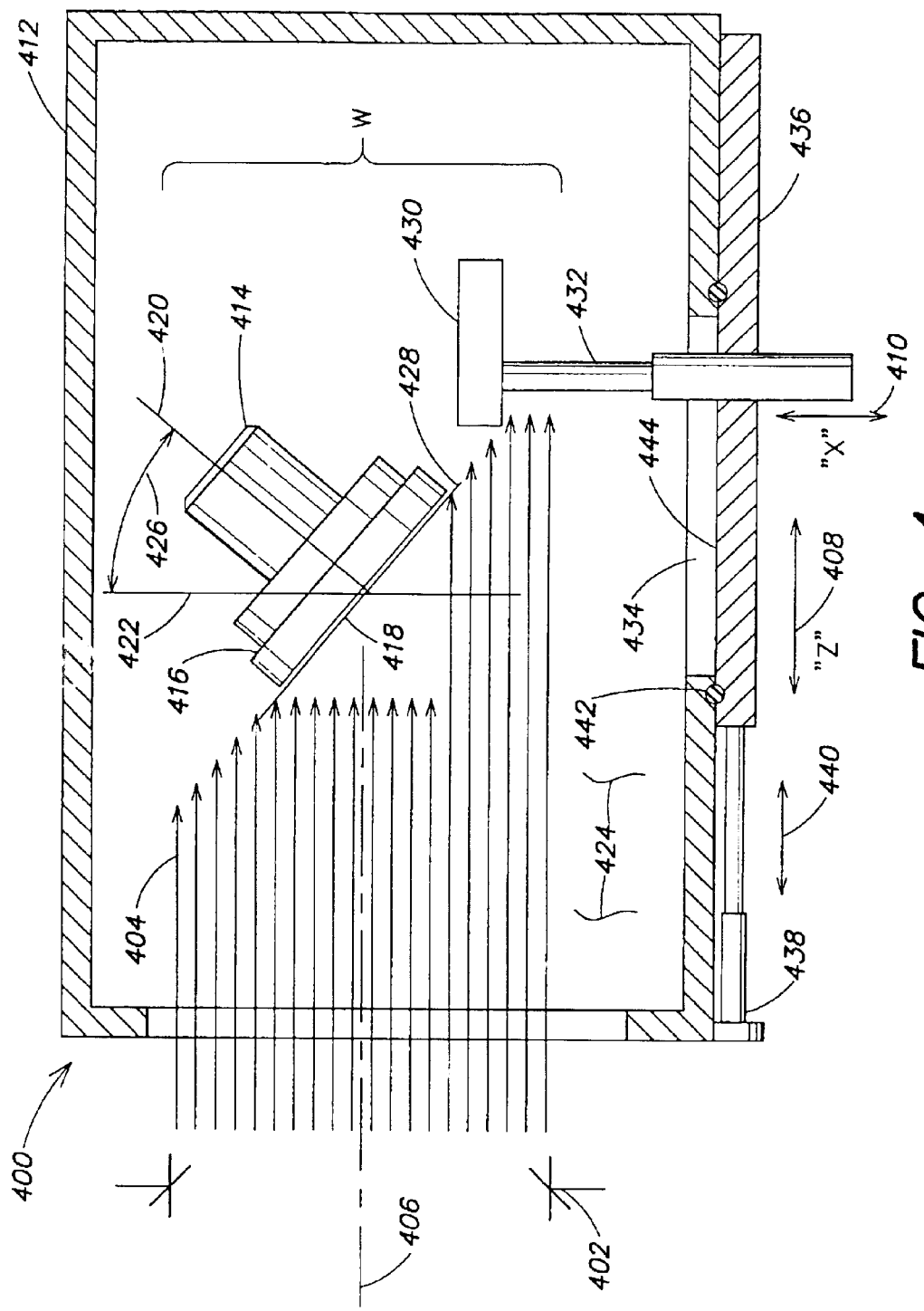
FIG. 4 is a top midsectional view of an ion implantation system including a rotational drive arm that may be used to adjust the implant angle.

FIG. 4 is a midsectional top view depicting an ion implantation system 400 according to the various embodiments and instrumentalities of the invention. An ion beam source 402 is used to generate an ion beam 404, which may be any type of ion beam that is suitable for ion implantation purposes. The ion beam 404 may, for example, be a fan beam or a parallel beam. The ion beam source 402 optionally projects the ion beam 404 as a ribbon beam reaching across a beam width W, or the ion beam 404 may be magnetically or electrostatically scanned across the beam width W. On average, the ion beam 404 travels along beam axis 406, which is parallel to a z-axis 408 of system 400. An x-axis 410 is parallel to the beam width W. In preferred embodiments, the beam source 402 has conventional selectively adjustable beam quality control systems that are used to adjust features of the ion beam 404, such as ion density and ionic particle direction. The ion beam source 402 projects ion beam 404 into an ion implant chamber 412.

A workpiece holder 414 retains a workpiece, such as wafer 416, by internal vacuum or clamping structure (not depicted). Wafer 416 presents an implant surface 418 that receives impinging ions from ion beam 404 for ion implantation purposes. Line 420 is normal to implant surface 418. Line 422 is parallel to the x-axis 410 and represents the position that implant surface 418 would occupy with zero degrees of rotation when line 420 is parallel to beam axis 406. The workpiece holder 414 is selectively rotatable within any z-x axis plane 424, such that clockwise or counterclockwise rotation of workpiece holder 414 produces a rotation angle 426. The rotation angle 426 is 90° when the workpiece 414 is in an unrotated condition, such that line 420 is parallel with beam axis 406 and implant surface 418 is aligned with line 416. The workpiece holder 414 may have any range of rotational freedom in the z-x plane 424, but preferably has a −45° to 45° range of rotational freedom such that rotation angle 426 ranges from 45°to 135°. Where, for example, the workpiece holder 414 has a 0° to 45° range of rotational freedom, the rotation angle may vary from 45° to 90°. Rotation of workpiece holder 414 causes a corresponding rotation of implant surface 418 when wafer 416 is placed within the workpiece holder 414. Accordingly, the planar implant surface 418, or even a curved surface if need be, can be projected along line 428 which, according to the areal extent of implant surface 418, represents an intended or actual location of implant surface 418 during ion implant operations.

A Faraday cup 430 resides in ion implantation chamber 412 for purposes of measuring the ion density of ion beam 404 along a plane that is coincident with line 428. A drive arm 432, such as a motor-driven linear shaft, controls translational motion of the Faraday cup 430 in parallel with the x-axis 410. The ion implantation chamber 412 contains a slot 434 that permits passage of the drive arm 432 together with z-axis translational movement of drive arm 432 that is facilitated by sliding motion of wall 436 in parallel with the z-axis 408. This z-axis translational motion of wall 436 may be facilitated, for example, by extension or retraction of a motor-driven linear shaft 438 in the direction of arrow 440. Wall 436 may be retained on vacuum chamber 412 by upper and lower track assemblies (not depicted), with a vacuum seal 442 circumscribing slot 434 so that vacuum conditions inside ion implantation chamber 412 are enhanced by the force on seal 442 by the action of vacuum pressure on surface 444.

Figure 5:
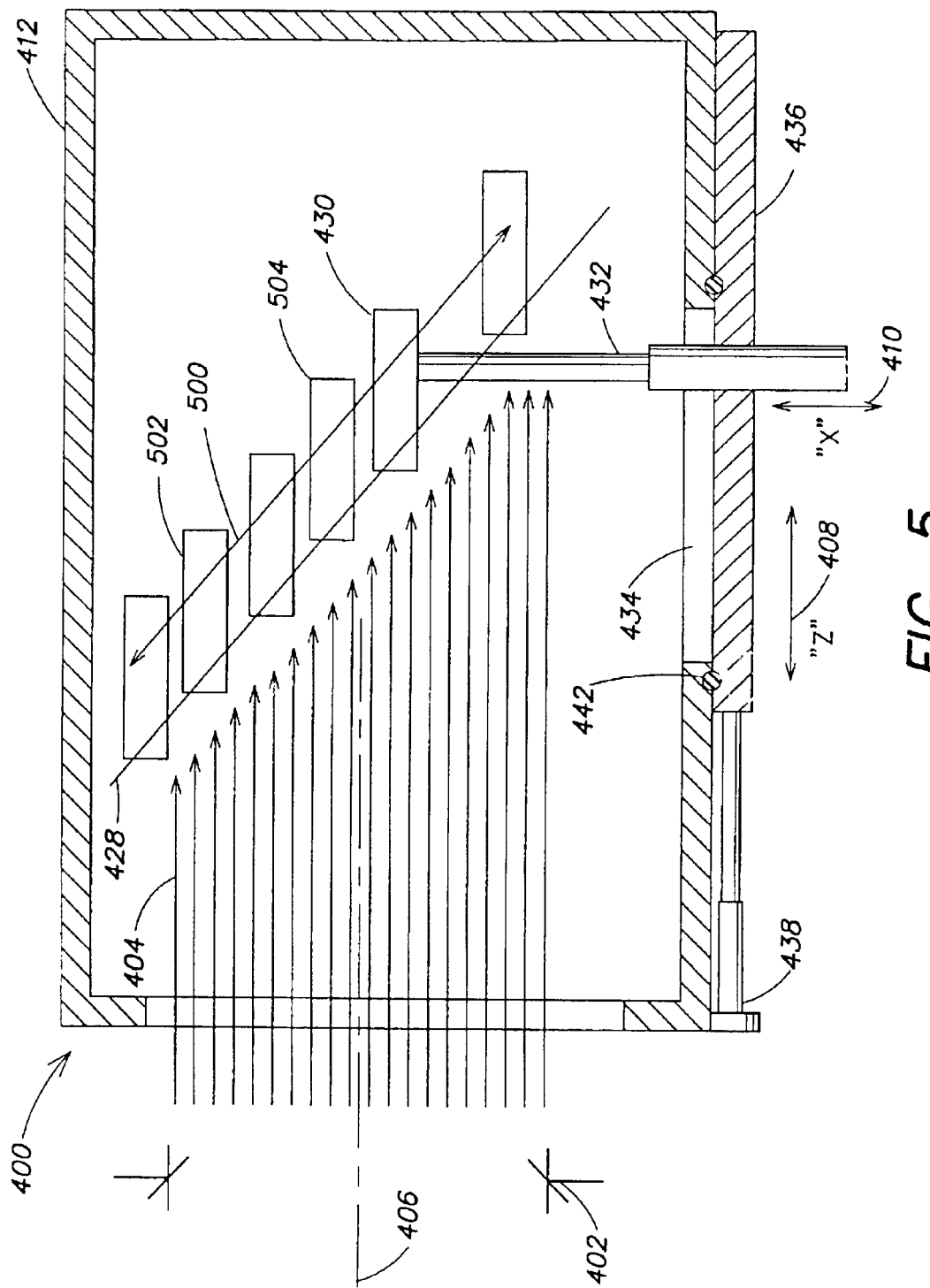
FIG. 5 a top midsectional view showing an ion beam setup sampling system that may be used in conjunction with the system shown in FIG. 4.

By these instrumentalities, the Faraday cup 430 has at least two degrees of translational freedom, namely, freedom in the X-axis and Z-axis directions, such that the Faraday cup 430 may follow line 428 to establish a setup plane coincident with line 428 and the intended location of implant surface 418 during implant operations. The workpiece holder 414 may be lowered during setup operations to make room for Faraday cup 430. FIG. 5 depicts the Faraday cup 430 in relationship to a line of travel 500 that exists in parallel with line 428, such that the center of Faraday cup 430 travels across a plane that is generally centered on line 428 by the action of arm 432 and shaft 438. The Faraday cup obtains measurements from ion beam at a plurality of selected locations, such as locations 502 and 504 along the line of travel 500.

Figure 6:
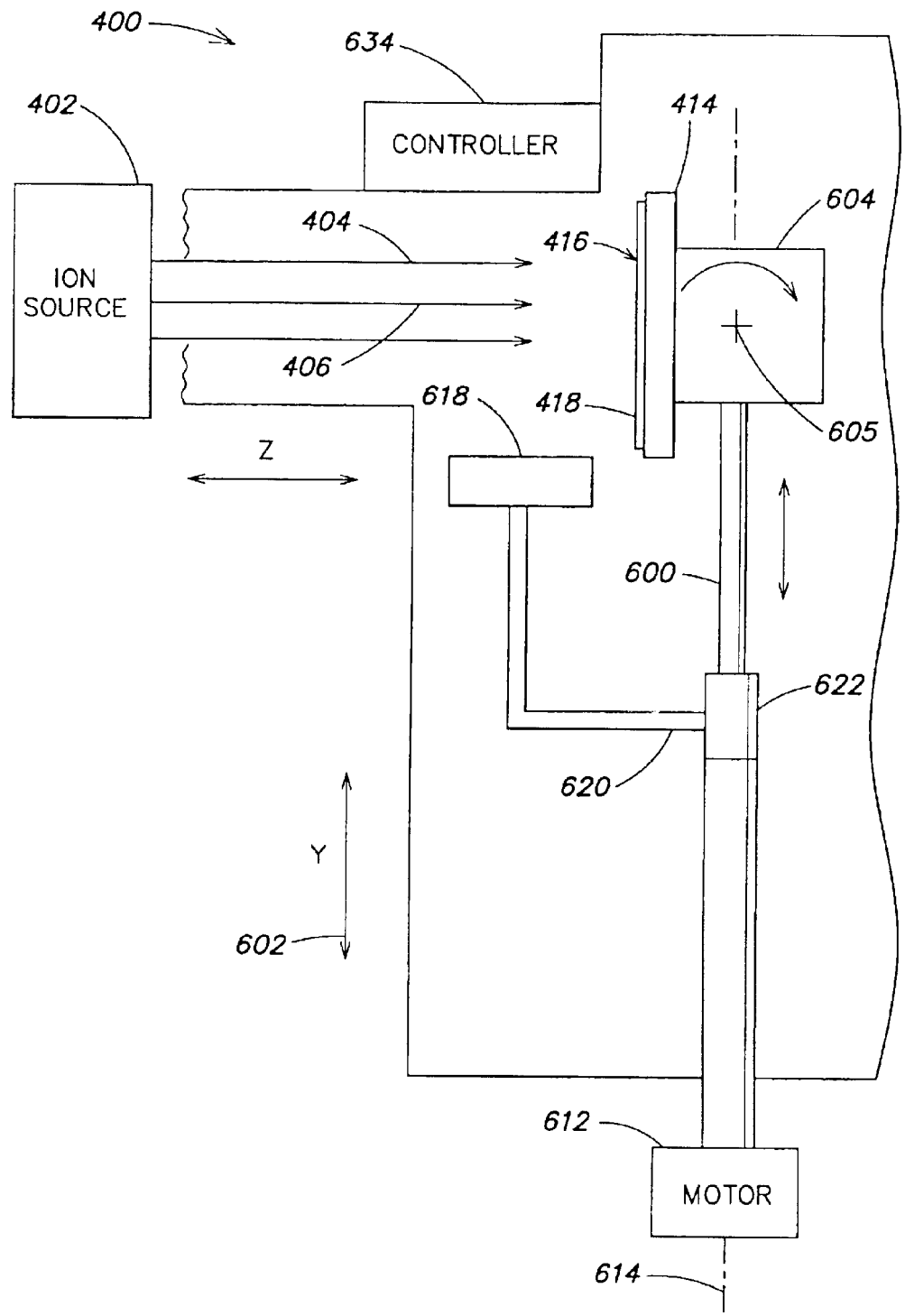
FIG. 6 is a side elevation midsectional view of the system shown in FIG. 4.

FIG. 6 shows the ion implantation system 400 from a side elevation midsectional view. The workpiece holder 414 is mounted to a motor-driven shaft 600 that is scanned in the Y-axis direction 602 sufficient to pass surface 418 of workpiece 416 completely through ion beam 404. Shaft 600 is part of a vertical scanning mechanism A servo-controlled knuckle 604 permits workpiece holder 414 and workpiece 416 to be rotated about an axis 605 between a vertical position as shown in FIG. 6 and a horizontal position for interaction with conventional wafer transfer apparatus (not depicted). A motor 612 is adapted for rotation of shaft 600 about axis 614, which is parallel to the system Y-axis 602. Workpiece holder 414 and workpiece 416 may be rotated to a variety of selectively adjustable fixed positions of rotation resulting in different rotation angles 426, as shown in FIG. 4. The magnitude of rotation angle 426 is adjusted by the actuation of motor 612.

A flood gun 618 may be attached by a arm 620 to a sleeve 622 on the vertical scanning mechanism. The flood gun 618 is positioned in front of the workpiece 416 for charge neutralization and is positioned to avoid blocking ion beam 404. Arm 620 and sleeve 622 are configured such that flood gun 618 rotates about axis 614 to the same angle as workpiece holder 414. The flood gun 618 remains at a fixed angle as workpiece holder 414 is scanned vertically by shaft 600. Thus, electrons emitted from flood gun 618 maintain a consistent orientation, in terms of degrees of rotation, with respect to workpiece holder 414 and workpiece 416.

Figure 7A:
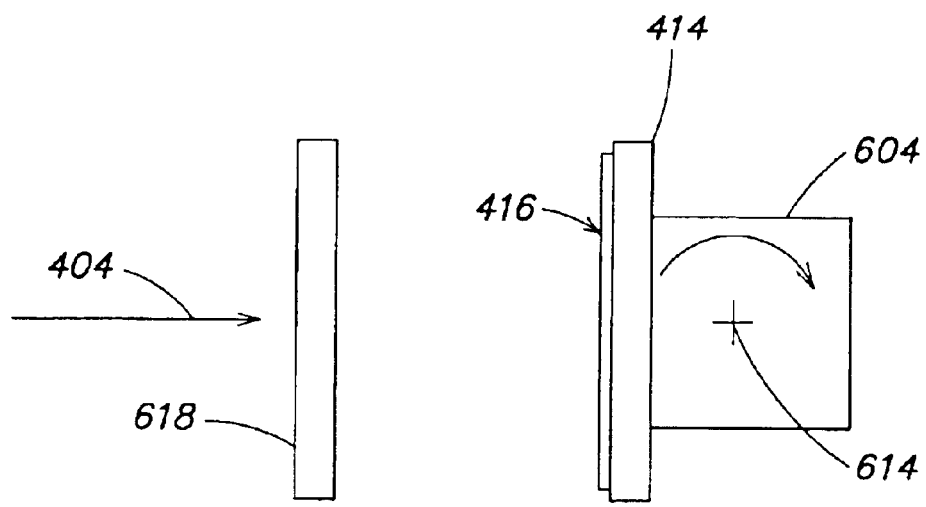
FIGS. 7A and 7B are top views of the system shown in FIG. 6, for different rotation angles of the workpiece.
Figure 7B:
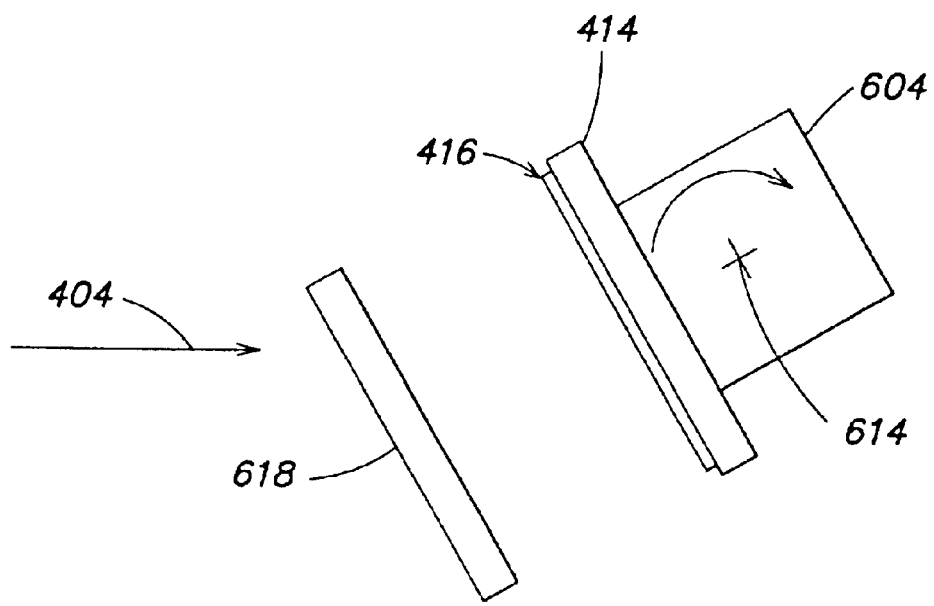

This matching degree of rotation assures that ion implantation from ion beam 404 is unaffected by variances in electron emission and associated field effects on workpiece 416. Furthermore, workpiece 416 always presents a constant cross-sectional area to electron emissions the flood gun 618, as shown in FIGS. 7A and 7B. This constant cross-sectional area avoids the need to adjust the electron output of flood gun 616 for different workpiece rotation angles.

A controller 634 provides control of all system elements, such as quality control of ion beam 404 in response to measurements from Faraday cup 430. It should be noted that such beam control differs from prior art practices in that the features of ion beam 404 are adjusted in response to measurements in a setup plane that includes line 428 (see FIG. 4), as opposed to a setup plane that is normal to beam axis 406. Controller 634 also provides control instructions for wafer handling, as well as operation of shaft 600, motor 612, knuckle 604 and sleeve 622, all according to the principles of motion that are described above.

The invention in its broader aspects is not limited to the specific details, representative devices and methods, and illustrative examples shown and described. Accordingly, departures may be made from such details without departing from the spirit or scope of the general inventive concept as defined by the appended claims and their equivalents.

We claim:

1. Apparatus for ion implantation, comprising:
   a source of ions having a first axis;
   a workpiece holder configured for mechanical scanning in linear motion along a path of motion perpendicular to the first axis;
   selectively adjustable rotation control structure for use in rotating a workpiece using the path of motion as an axis of rotation to orient an implant surface on the workpiece at a selected angle of rotation when the workpiece is mounted on the workpiece holder; and
   a beam measuring device configured for scanning along an intended location of the implant surface to provide a setup measurement coincident with the intended location.

2. The apparatus as set forth in claim 1, the source of ions comprising a parallel path fan beam having a two dimensional cross section normal to the first axis that is at least twice as large in one dimension than another.

3. The apparatus as set forth in claim 1, further comprising:
   at least one charge neutralization member selected from the group consisting of an electron flood gun and a plasma bridge directed toward the workpiece holder for neutralization of beam charge buildup, and
   a rotatable mechanism configured to maintain the charge neutralization member in corresponding rotational alignment with the workpiece holder.

4. The apparatus as set forth in claim 3, the rotatable mechanism being in alignment with the path of motion such that the rotatable mechanism can be rotated in linear alignment with the selectively adjustable rotation control structure so that an orientation of its spacing to the workpiece surface is maintained as a constant spacing.

5. The apparatus as set forth in claim 3, the rotatable mechanism comprising an arm adapted to maintain a constant spacing between the workpiece holder and the charge neutralization member.

6. A method for ion implantation of a workpiece comprising the steps of:
   generating an ion beam perpendicular to a first XY plane having an X-axis and a Y-axis;
   identifying a second plane by rotating the first XY plane about the Y-axis;
   measuring the effective ion beam intensity along a line in the second plane to provide a beam intensity signal;
   adjusting the ion beam based upon the beam intensity signal to obtain an adjusted ion beam having a desired ion beam intensity along the line in the second plane;
   rotating the workpiece to present an implant surface in alignment with the second plane; and
   translating the rotated workpiece along the Y axis to pass the workpiece through the adjusted ion beam to accomplish ion implantation in the workpiece.

7. The method according to claim 6, further comprising the step of:
   positioning a charge neutralization device in a position of rotational alignment with the workpiece.

* * * * *